United States Patent [19]

Eaton, Jr.

[11] 4,289,973
[45] Sep. 15, 1981

[54] AND-GATE CLOCK

[75] Inventor: Sargent S. Eaton, Jr., Colorado Springs, Colo.

[73] Assignee: Mostek Corporation, Carrollton, Tex.

[21] Appl. No.: 66,147

[22] Filed: Aug. 13, 1979

[51] Int. Cl.³ .................. H03K 19/08; H03K 19/20
[52] U.S. Cl. ................................ 307/448; 307/443
[58] Field of Search ........................... 307/208, 218

[56] References Cited

U.S. PATENT DOCUMENTS

| | | | |
|---|---|---|---|
| 3,601,624 | 8/1971 | Hayes | 307/151 |
| 3,644,750 | 2/1972 | Campbell | 307/218 |
| 3,898,479 | 8/1975 | Proebsting | 307/205 |
| 3,927,334 | 12/1975 | Callahan | 307/269 |
| 3,943,496 | 3/1976 | Padgett | 340/173 |
| 4,061,933 | 12/1977 | Schroeder et al. | 307/262 |

Primary Examiner—Harold A. Dixon

[57] ABSTRACT

An AND-gate clock having an input stage, an output stage, and an isolation stage. The input stage receives two signals, and gates them to produce a high signal. The output stage is used to drive a load typically having a large load capacitance when both signals are true. The isolation stage isolates the input stage from the output stage when only one signal is true, therefore preventing power dissipation by current flow through the output driver stage. The isolation stage provides an alternative current path through smaller transistors, thereby incurring lesser power dissipation and requiring less layout area. A small driver stage may then be used.

9 Claims, 3 Drawing Figures

U.S. Patent
Sep. 15, 1981
4,289,973
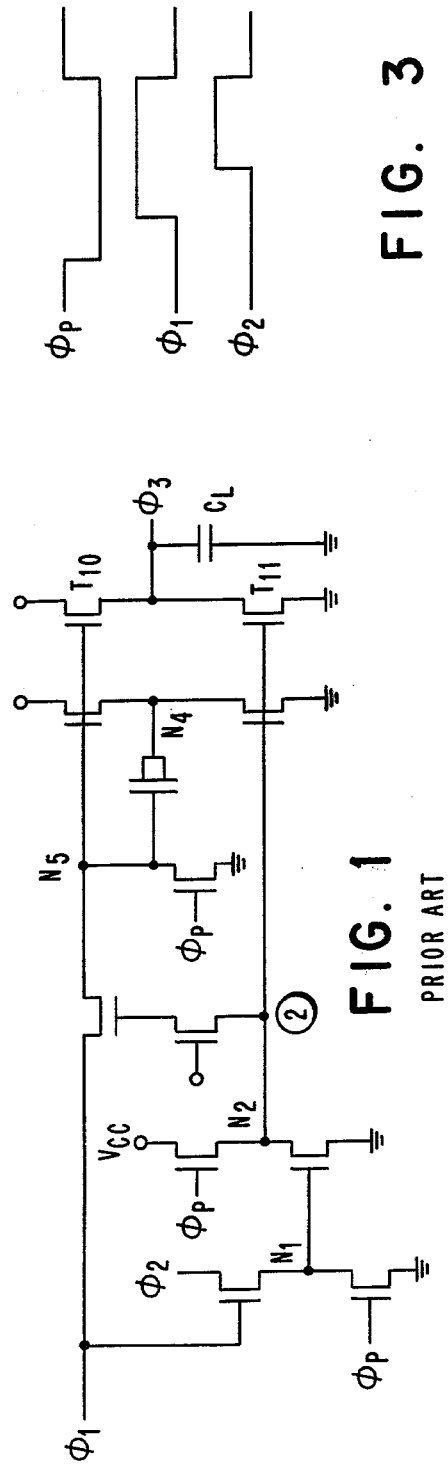
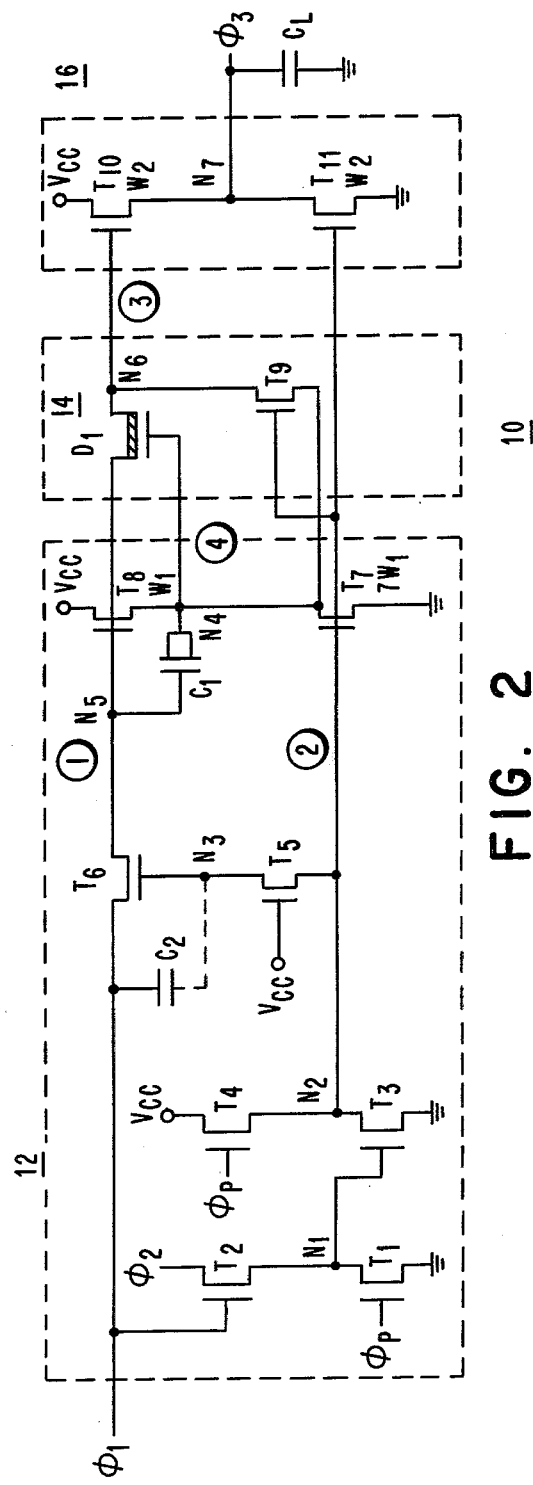

AND-GATE CLOCK

BACKGROUND OF THE INVENTION

1. Field of the Invention

This invention relates to metal oxide semiconductor technology and in particular to AND-gate clocks.

2. Description of the Prior Art

The AND-ing of two or more inputs in a dynamic MOS clock circuit has been a particularly difficult problem, primarily because of the large transistor sizes involved and the high power dissipated before the clock is triggered. Previously, signals were ANDed in a dynamic clock as shown in FIG. 1. In this circuit the transistors $T_{10}$ and $T_{11}$ form an output stage wherein $T_{10}$ is the driving transistor. In this circuit, the output $\phi_3$ is conditional upon both $\phi_1$ and $\phi_2$ being high. The problems occur when $\phi_1$ occurs earlier than $\phi_2$, since the node $N_5$ goes high while the Node $N_2$ remains high. In order to prevent $\phi_3$ from rising during this time, transistor $T_{11}$ is typically much larger than the transistor $T_{10}$. However, the driving transistor, $T_{10}$, must be very large in order to handle the capacitance $C_L$. Thus, $T_{11}$ becomes very large, as much as approximately 700 microns in channel length for $T_{10}=100$ microns. Also, during the time that $\phi_2$ remains low, a large amount of current flows through $T_{10}$ and $T_{11}$.

SUMMARY OF THE INVENTION

The present invention allows $\phi_1$ to occur earlier than $\phi_2$. However, in this circuit, the gate of $T_{10}$ remains low, holding $T_{10}$ off. The additional power dissipated during this time is only the current flowing through an additional depletion transistor and a drain transistor. This can be kept small, since the capacitive load on the gate of $T_{10}$ is only that associated with the driving transistor $T_{10}$, typically a small fraction of $C_L$. Also, the transistor $T_{11}$ can now be made equal or even smaller than $T_{10}$, since $T_{10}$ is now turned off. Finally, when the second output does go high, a full bootstrap voltage will appear on the input to the driving transistor, since the drain transistor will be turned off and the gate of the depletion transistor will be at the supply voltage. Therefore, considerable savings in power dissipation and layout area are achieved.

DESCRIPTION OF THE DRAWINGS

FIG. 1 is a schematic diagram of a prior art AND-gate clock;

FIG. 2 is a schematic diagram of one embodiment of the invention; and

FIG. 3 is a clock diagram for use in connection with the invention.

DESCRIPTION OF THE PREFERRED EMBODIMENTS

Referring now to FIG. 2, a preferred embodiment of the invention, an AND-gate clock, is generally indicated by reference numeral 10. The AND-gate clock 10 is generally made up of stages shown by the broken blocks 12, 14 and 16. Block 12 includes an input stage, Block 14 includes an isolation stage, and Block 16 includes an output stage.

Looking to the input stage 12, a first transistor $T_1$ is shown with its source grounded and its gate tied to a precharge signal. A second transistor, $T_2$, has its source connected to the drain of the transistor $T_1$, forming a node 1, $N_1$. The transistor $T_2$ receives a first signal, $\phi_1$, at its gate, and a second signal, $\phi_2$, at its drain. A third transistor, $T_3$, has its source grounded and its gate tied to the node, $N_1$. The drain of the transistor $T_3$ is tied to the source of a transistor, $T_4$, forming a node $N_2$. The gate of the transistor $T_4$ is tied to a precharge signal while the drain is connected to a supply voltage, $V_{cc}$. A fifth transistor, $T_5$, has its source tied to the node $N_2$ and its gate connected to the supply voltage $V_{cc}$. The drain of the transistor $T_5$ is tied to the gate of a sixth transistor, $T_6$. The sixth transistor, $T_6$, has its drain tied to the input first signal, $\phi_1$. A seventh transistor, $T_7$, has its source grounded and its gate tied to the node $N_2$. The drain of $T_7$ is connected to the source of an eighth transistor, $T_8$, whose gate is tied to the source of $T_6$. The drain of the eighth transistor, $T_8$, is tied to supply voltage $V_{cc}$. Finally, a capacitance $C_1$ is connected between the source of the transistor $T_8$ at the node $N_4$ and the gate of the transistor $T_8$ at node $N_5$.

The isolation stage 14 includes two transistors, $T_9$ and $D_1$. $D_1$ is a depletion transistor. The transistor $T_9$ has its source connected to the node $N_4$ and its gate connected to the node $N_2$. The drain of the transistor $T_9$ is tied to node $N_6$ to which the source of the transistor $D_1$ is also tied. The drain of the transistor $D_1$ is tied to the node $N_5$ and its gate is tied to the node $N_4$.

The output stage is a driver circuit composed of transistors $T_{10}$ and $T_{11}$. $T_{10}$ is a driver transistor with its gate connected to the node $N_6$ and its drain connected to supply voltage $V_{cc}$. The source of the transistor $T_{10}$ is tied to a node $N_7$ which forms an output $\phi_3$. The transistor $T_{11}$ has its source grounded and its gate connected to the node $N_2$. The drain of the transistor $T_{11}$ is connected to the node $N_7$. A load capacitance is represented by the capacitor $C_L$ connected at the output $N_7$.

The operation of the AND-gate clock 10 may now be observed by referring to the timing diagram of FIG. 3. During precharge, $\phi_1$ and $\phi_2$ will be at zero volts and the precharge signal will be at a voltage level, typically $V_{cc}$. In this manner the transistor $T_1$ is turned on while $T_2$ is off, bringing the node $N_1$ to zero volts. This turns off the transistor $T_3$ while the transistor $T_4$ has been turned on by a precharge signal, bringing node $N_2$ to $V_{cc}-V_T$, where $V_T$ is the threshold voltage. Transistor $T_5$ is similarly turned on by the supply voltage $V_{cc}$, which brings the node $N_3$ to $V_{cc}-V_T$. In this manner, transistor $T_6$ is turned on, but the source and drain will be at zero volts because of $\phi_1$. The voltage at $N_2$ turns on the transistor $T_7$, bringing $N_4$ to ground. As $N_4$ and $N_5$ are now at zero volts, the transistor $T_8$ is off.

Because of the voltage at $N_2$, the transistor $T_9$ is turned on, bringing the node $N_6$ to ground. Remembering that a transistor is on whenever $V_G-V_S-V_T$ is greater than 0, and that a depletion transistor has a negative threshold voltage, the zero volts at $N_4$ will still turn on the transistor $D_1$. Because of the small difference between $V_G$ and $V_S$, depletion transistor $D_1$ will operate somewhat as a resistance.

Transistor $T_{10}$ will be turned off by the zero voltage at its gate while the transistor $T_{11}$ is turned on by the voltage level at $N_2$, thereby taking the node $N_7$ to ground. Therefore, at this point, $\phi_3$ is at zero output while both input signals are at zero input.

If $\phi_1$ and $\phi_2$ occur simultaneously, the circuit operates as a clock circuit and the invention serves to produce an output at $\phi_3$. However, $\phi_1$ and $\phi_2$ do not always occur simultaneously, and, in many applications, $\phi_2$ may well occur after $\phi_1$. Note that one objective here is to keep $\phi_3$ low until both $\phi_1$ and $\phi_2$ are high.

Referring to the prior art circuit in FIG. 1, if $\phi_1$ occurs earlier than $\phi_2$, $N_5$ will be driven high while $N_2$ will remain high. A large current flow then occurs through transistors $T_{10}$ and $T_{11}$, which can only be compensated for by making transistor $T_{11}$ much larger than transistor $T_{10}$. This is typically seven times as large. However, the transistor $T_{10}$ must be very large in order to drive the load capacitance. Therefore, transistor $T_{11}$ is larger than desirable.

Under the invention disclosed here, if only $\phi_1$ goes high, while in the meantime $\phi_p$ has gone to a zero stage, transistor $T_1$ is turned off while transistor $T_2$ is turned on. However, node $N_1$ remains at zero volts because of the input at $\phi_2$. Therefore, $T_3$ remains off, while $T_4$ has similarly turned off. $N_2$ will remain floating at about $V_{cc}-V_T$ while $N_3$, due to the inherent capacitance $C_i$ across the gate and drain of $T_6$, will float up due to the rise of $\phi_1$. Thus, a full signal $\phi_1$ is transmitted across the transistor $T_6$.

It should be noted that the node $N_4$ has remained at ground and the full signal at $N_5$ will now charge the capacitors $C_1$. Transistor $T_8$ has turned on, which will then raise the node $N_4$ to a point between $V_{cc}$ and ground due to the current flow between $T_8$ and $T_7$. This rise in voltage at $N_4$ will raise the node $N_5$ even higher because of a bootstrap effect and will maintain $D_1$ in an on state. The transistor $D_1$ and the transistor $T_9$ are ratioed to give approximately zero volts at $N_6$. This is done by making $T_9$ larger than $D_1$. In a typical case, the channel $W_1$ of $D_1$ might be 8 microns, causing the channel of $T_9$ to be approximately 56 microns. Finally, $T_{10}$ is maintained off by the low voltage at $N_6$, and $T_{11}$ remains on, keeping $N_7$ at zero.

Now as $\phi_2$ rises to its voltage level, $T_2$ is turned on, bringing $N_1$ to a full $V_{cc}-V_T$, and turning on $T_3$, bringing $N_2$ to zero volts. $N_3$ will now be brought toward zero volts, turning off $T_6$, although $N_5$ maintains its charge due to $C_1$. $T_7$ is now turned off as is $T_{11}$, which brings $N_4$ to $V_{cc}-V_T$. This turns on the transistor $D_1$ hard with a full transmission of the charged $N_5$ to the node $N_6$, which turns on the transistor $T_{10}$. Because of the bootstrap effect at $N_5$ and $N_6$, the node $N_7$ will receive a full $V_{cc}$. $\phi_3$ now is an output at a $V_{cc}$ level.

In summary, the upper path through the transistor $T_6$ has offered a faster path than the lower path through transistors $T_2$, $T_3$. While the prior art allowed a current flow through transistors $T_{10}$ and $T_{11}$, the AND-gate clock 10 provides an alternative current flow through $D_1$ and $T_9$. In this manner, $T_{11}$ does not have to be made significantly larger than $T_{11}$, as $T_9$ and $D_1$ have accomplished this purpose.

What is claimed is:

1. An AND-gate clock comprising:
   an input stage adapted to receive a first and a second input signal for providing a plurality of interstage signals in response to the first and second input signals;
   an output stage for driving a load having a large capacitance; and
   an isolation stage means coupled between the input stage and the output stage for receiving the plurality of interstage signals and for enabling the output stage to provide a true level to the load only when the first and second input signals are at a true level.

2. The AND-gate clock of claim 1 wherein the isolation stage means provides a current path in alternative to current flow through the output stage when the second input signal is at a false level.

3. The AND-gate clock of claim 1 wherein the input stage comprises:
   a first MOSFET having its source grounded and its gate connected to a precharge signal;
   a second MOSFET having its source connected to the drain of the first MOSFET, its gate connected to a first input, and its drain connected to a second input;
   a third MOSFET having its gate connected to the drain of the first MOSFET and its source grounded;
   a fourth MOSFET having its source connected to the drain of the third MOSFET, its gage connected to a precharge signal, and its drain connected to a supply voltage;
   a fifth MOSFET having its source connected to the drain of the third MOSFET and its gate connected to a supply voltage;
   a sixth MOSFET having its drain connected to the first input and its gate connected to the drain of the fifth MOSFET;
   a seventh MOSFET having its source grounded and its gate connected to the drain of the third MOSFET;
   an eighth MOSFET having its source connected to the drain of the seventh MOSFET, its gate connected to the source of the sixth MOSFET, and its drain connected to a supply voltage;
   a capacitance connected between the gate and source of the eighth MOSFET.

4. The AND-gate clock of claim 3 wherein the isolation stage comprises:
   a ninth MOSFET having its source connected to the drain of the seventh MOSFET and its gate connected to the drain of the third MOSFET; and
   a depletion channel MOSFET having its drain connected to the source of the sixth MOSFET, its gate connected to the drain of the seventh MOSFET, and its source connected to the drain of the ninth MOSFET.

5. The AND-gate clock of claim 1 wherein the output stage comprises:
   a first MOSFET having its gate coupled to the isolation stage means and its drain connected to a supply voltage; and
   a second MOSFET having its source grounded, its gate coupled to the input stage, and its drain connected to the source of the first MOSFET whereby an output capable of driving a large load capacitance is produced at the source of the first MOSFET when the first and second input signals are high.

6. The AND-gate clock of claim 1 wherein the input stage has three outputs and the isolation stage means comprises:
   a first MOSFET having its gate connected to a first output of the input stage and its source connected to a second output of the input stage; and
   a depletion channel MOSFET having its drain connected to a third output of the input stage, its gate connected to the source of the first MOSFET and its source connected to the drain of the first MOSFET.

7. A circuit for driving a large load capacitance when two input signals are high comprising:
   a first input node;

a second input node;

circuit means for turning on a first MOSFET when the second input node is low and for turning the first MOSFET off when both the first input node and the second input node are high;

a driver stage for producing a high level output when the first MOSFET is turned off; and an isolation stage coupled between the circuit means and the driver stage and containing a depletion channel MOSFET responsive to the first MOSFET for causing the driver stage to produce a high level output when the first MOSFET is turned off.

8. The AND-gate clock of claim 7 wherein the isolation stage provides a current path to divert current from the output stage when the first signal is high and the second signal is low.

9. An AND-gate clock comprising:

a first MOSFET having its source grounded and its gate connected to a precharge signal;

a second MOSFET having its source connected to the drain of the first MOSFET, its gate connected to a first input, and its drain connected to a second input;

a third MOSFET having its gate connected to the drain of the first MOSFET and its source grounded;

a fourth MOSFET having its source connected to the drain of the third MOSFET, its gage connected to a precharge signal, and its drain connected to a supply voltage;

a fifth MOSFET having its source connected to the drain of the third MOSFET and its gate connected to a supply voltage;

a sixth MOSFET having its drain connected to the first input and its gate connected to the drain of the fifth MOSFET;

a seventh MOSFET having its source grounded and its gate connected to the drain of the third MOSFET;

an eighth MOSFET having its source connected to the drain of the seventh MOSFET, its gate connected to the source of the sixth MOSFET, and its drain connected to a supply voltage;

a capacitance connected between the gate and source of the eighth MOSFET;

a ninth MOSFET having its source connected to the drain of the seventh MOSFET and its gate connected to the drain of the third MOSFET;

a depletion channel MOSFET having its drain connected to the source of the sixth MOSFET and its gate connected to the drain of the seventh MOSFET;

a tenth MOSFET having its gate connected to the source of the depletion MOSFET and its drain connected to a supply voltage; and an eleventh MOSFET having its source grounded, its gate connected to the drain of the third MOSFET, and its drain connected to the source of the tenth MOSFET whereby an output capable of driving a large load capacitance is produced at the source of the tenth MOSFET when the first and second inputs are high.

* * * * *